US012724942B2

(12) United States Patent
Gallusser

(10) Patent No.: US 12,724,942 B2
(45) Date of Patent: Sep. 1, 2026

(54) GENERATION OF COHORT-AGNOSTIC FEATURES FOR MODELS

(71) Applicant: Disney Enterprises, Inc., Burbank, CA (US)

(72) Inventor: Fabian Gallusser, Palo Alto, CA (US)

(73) Assignee: Disney Enterprises, Inc., Burbank, CA (US)

( * ) Notice: Subject to any disclaimer, the term of this patent is extended or adjusted under 35 U.S.C. 154(b) by 817 days.

(21) Appl. No.: 18/297,554

(22) Filed: Apr. 7, 2023

(65) Prior Publication Data

US 2024/0338500 A1 Oct. 10, 2024

(51) Int. Cl.
*G06F 30/20* (2020.01)

(52) U.S. Cl.
CPC .................................... *G06F 30/20* (2020.01)

(58) Field of Classification Search
CPC ....................................................... G06F 30/20
USPC .............................................................. 703/6
See application file for complete search history.

(56) References Cited

U.S. PATENT DOCUMENTS 11,080,336 B2 * 8/2021 Van Dusen ....... G06F 16/90335
11,333,575 B2 * 5/2022 Zhang ................. G01M 13/045
12,626,784 B2 * 5/2026 Morris ............. G01N 33/57535
2024/0012965 A1 * 1/2024 Yang ....................... G06F 30/17

* cited by examiner

*Primary Examiner* — Justin C Mikowski
(74) *Attorney, Agent, or Firm* — Kwan & Olynick LLP

(57) ABSTRACT

In some embodiments, a method receives a first value for a feature. The first value is associated with an entity. A cohort is determined for the entity where a cohort is associated with a dimension, and the entity is associated with a dimension value for the dimension. The method determines a normalization value for the cohort based on the dimension value for the entity. The normalization value is generated based on second values at the dimension value for the feature, and the second values are associated with entities in the cohort. A cohort-agnostic feature value is generated based on the first value and the normalization value. The cohort-agnostic feature value is input into a model to generate a prediction for the entity.

20 Claims, 7 Drawing Sheets

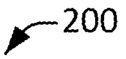
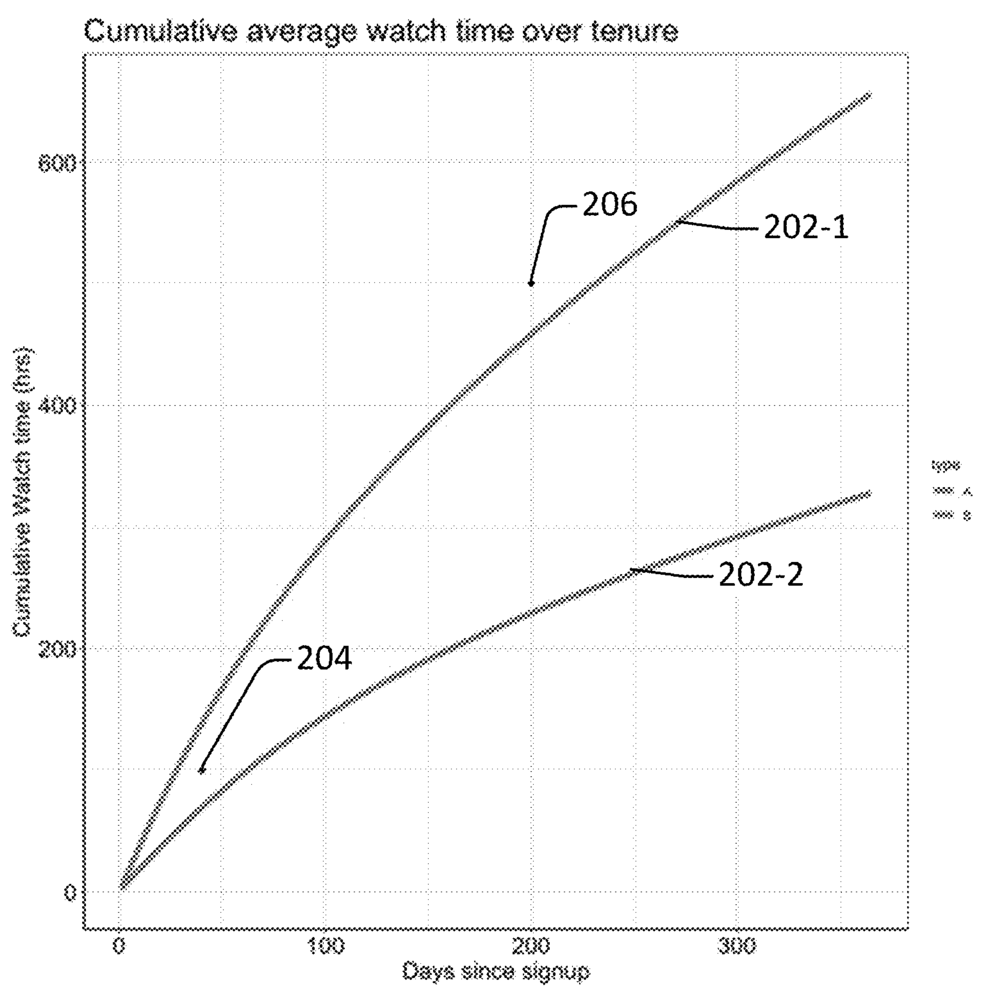
FIG. 2A
208
| User Account | Tenure | Cumulative hours watched | Normalization value | Ratio |
|---|---|---|---|---|
| 1 | 40 | 100 | 138 | 0.72 |
| 2 | 200 | 500 | 458 | 1.09 |
210 212 214 216 218 220 222
FIG. 2B

GENERATION OF COHORT-AGNOSTIC FEATURES FOR MODELS

BACKGROUND

A service may generate a prediction for a user account of the service, such as a prediction of an action, an outcome, a classification, etc. For example, a content delivery service may want to predict whether a user account will upgrade the service, cancel the service, watch some content, classify the user account in a group (e.g., age groups, gender, parents with kids, single, etc.), etc. Other predictions may be used, such as upgrading a bank account, classification of users that attend parks, etc. Features may be used as input to models to generate the predictions. For example, if a feature of hours streamed is used, a problem with temporality may occur, such as a prediction for a first user account who streamed 10 hours and signed up for the service a week ago may be the same as a second user account who streamed the same number of hours, but signed up a month ago. However, generating the same prediction for the first user account and the second user account may not be an accurate prediction. Indeed, in the previous example, the user account having streamed 10 hours over a week will have a much higher daily engagement than the user account with 10 hours over a month, and the system should therefore expect different predictions for these two user accounts.

To address the above problem, multiple models may be used to capture the differences in tenure. For example, one model may be used for user accounts that have a tenure on the service of less than a certain number of days, such as less than a week. Also, another model may be used for users that have a longer term tenure, such as more than a week. The predictions may be improved, but many models may be needed because different granularities of tenures may be needed, such as models for every day, month, years, etc., may be needed.

The above issue is not restricted to temporality, but by also other dimensions. If user accounts are in different regions, problems related to geographical differences may result, such as the number of hours streamed during a day may have different meanings in different regions of the world. For example, streaming one hour a day may be considered low in one country, but high in another country. Also, the availability of content may be a factor. For example, if only two seasons of a show is available in a first country, a user account that streams two seasons of the show in the first country may be more likely to stream more of the show if available compared to a user account that streamed four seasons of a show in a country where there were 32 available seasons. Accordingly, using a single model for user accounts in different countries may not provide optimal predictions. The problem also applies to other areas, such as tenure at a bank, different parks in different geographic locations, etc.

Also, a model may be biased, such as in classifying user accounts as having children. One characteristic of user accounts without children is that they may typically have lower engagement than user accounts with children. When a user account first joins the content delivery service, the user account may naturally have a lower engagement due to just starting out. However, a model may over-classify new users as having no children because of the recency bias of just starting out.

BRIEF DESCRIPTION OF THE DRAWINGS

The included drawings are for illustrative purposes and serve only to provide examples of possible structures and operations for the disclosed inventive systems, apparatus, methods and computer program products. These drawings in no way limit any changes in form and detail that may be made by one skilled in the art without departing from the spirit and scope of the disclosed implementations.

FIG. 2A depicts an example of a normalization curve according to some embodiments.

FIG. 2B depicts a table that summarizes data for user accounts according to some embodiments.

DETAILED DESCRIPTION

Figure 1:
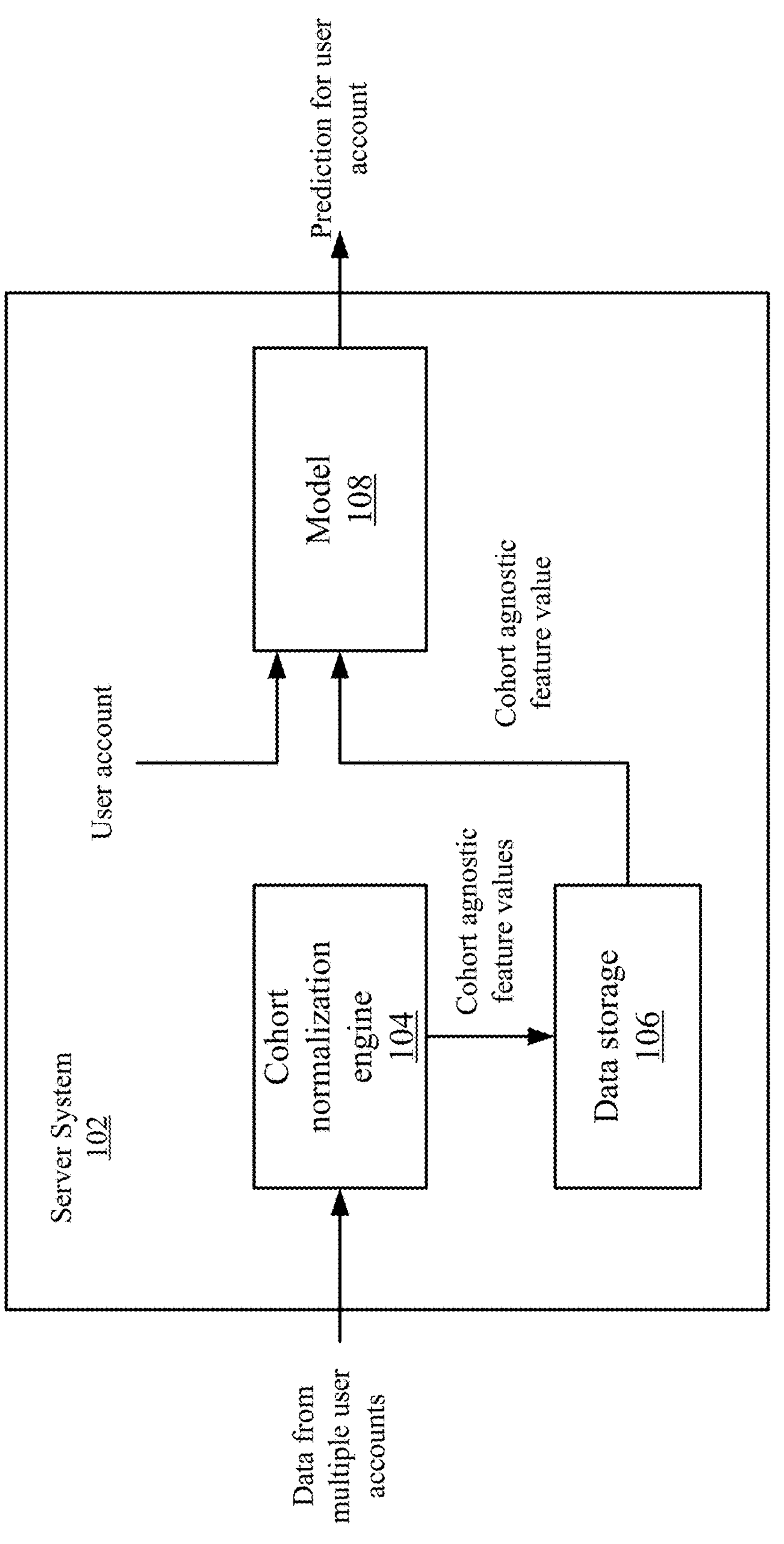
FIG. 1 depicts a simplified system for generating cohort-agnostic feature values and predictions according to some embodiments.

Described herein are techniques for an analysis system. In the following description, for purposes of explanation, numerous examples and specific details are set forth to provide a thorough understanding of some embodiments. Some embodiments as defined by the claims may include some or all the features in these examples alone or in combination with other features described below, and may further include modifications and equivalents of the features and concepts described herein.

Overview

A system, such as a system for a content delivery service, may generate cohort-agnostic feature values that can be input into a model to generate a prediction. A cohort may be defined by dimensions, such as time, geography, etc. The cohort-agnostic features may improve the features that are used as input, and also the prediction by being agnostic to differences in dimension values that may exist for a cohort or multiple cohorts. For example, the features may be temporally—(e.g., tenure) and geographically—(e.g., region) agnostic using techniques described herein, but may also be agnostic of other dimensions, such as demographics, genre, other segmentation groupings, etc. By making the features cohort-agnostic, a single model may be used to generate predictions for feature that may be associated with multiple dimension values for a cohort or cohorts.

The system may generate cohort-agnostic feature values by first classifying entities, such as user accounts, in a cohort based on the dimensions of the respective cohort and characteristics for the entity. In some embodiments, a first cohort may be associated with a dimension of tenure. Instead of classifying user accounts based on different tenures, such as user accounts that have a tenure of 1 week or less from the initial signup of the service, and user accounts that have a tenure of 1 week to 2 weeks from the initial signup of the service, a single cohort for all user accounts with different tenures may be used. In other embodiments, multiple cohorts may be formed for a dimension, such as a first cohort may be associated with user accounts that are in a country

#1, and a second cohort may be associated with user accounts that are in a country #2.

After determining the cohorts, the system performs a normalization for user accounts within each cohort. In some embodiments, normalization information is generated based on feature values, such as normalization values or a normalization curve. For example, a normalization curve is generated that is based on an average cumulative watch time of content (e.g., a feature) across a tenure (e.g., a dimension) for user accounts of a cohort. Then, the system can take a user value that is based on the cumulative watch time and tenure value for a user account, and compare the user value to a corresponding normalization value (e.g., a corresponding point on the normalization curve). A difference or deviation of the user value from the normalization value at the tenure value may be used to generate a cohort-agnostic feature value. Accordingly, the cohort-agnostic feature value may be a deviation from a corresponding average value for the dimension value. In some examples, a user account may have a tenure of 40 days and has a cumulative watch time of 100 hours. An average value of 138 hours is the normalization value, which indicates user accounts in the cohort had an average of 138 hours of cumulative watch time at 40 days of tenure. A ratio of the user value divided by the average value from the normalization curve may be used as the cohort agnostic feature value. For example, a value of 0.72 may indicate that a user account is under-watching compared to average normalization value and a value of 1.09 may indicate that a user account is over-watching compared to average normalization value, wherein a value of 1.00 may indicate the user value is equal to the normalization value. The above process is used to generate cohort-agnostic feature values for user accounts from different cohorts. For example, user accounts in different cohorts may receive similar cohort-agnostic feature values, such as 0.75 or 1.15. These values compare a user account to the average normalization value in that specific cohort.

The system may input the cohort-agnostic feature value into the model, which generates a prediction based on the input value. The model is trained to process the cohort-agnostic feature values to generate predictions. Because the cohort-agnostic feature values are normalized based on a respective dimension of the cohort, a single model can be used to process cohort-agnostic feature values from different dimension values. This is different from using multiple models that are trained to process the feature values from specific cohorts. Previously, if a user has watched 100 hours of content, and has a tenure of 40 days, a system may have used a model that interprets the number of hours based on a tenure that is below 50 days. Then, if a second user account has watched the same number of hours, but has a tenure of 200 days, the system would have used a second model that has been trained to process the number of hours for user accounts with a tenure over 50 days. In contrast, a cohort-agnostic value is 0.72 for a first user account in a first cohort and 1.09 for a second user account in a second cohort may be processed by a single model even though the feature values were associated with different tenures. The cohort-agnostic feature values represent a value for individual user accounts compared to their expected values at a dimension value for the respective cohort.

Also, the use of cohort-agnostic feature values provides a technical improvement in the use of the models because a single model can be used to analyze feature values for user accounts that are associated with multiple dimension values for a cohort or cohorts. This simplifies the training of models because one model is used and trained. The computation is simplified because the single model is used instead of multiple models. The prediction accuracy may be improved because the training of a single model may be simpler to determine parameters to generate an accurate prediction. Using a single model, more robust data can be used to train the single model. For example, if there are multiple models, the training data may be split into cohorts. For example, if there is one model per day and per geography, the system might only have one user with tenure=341 days in a first country, which may not be enough data to train the model or derive any observations. Maintaining a single model is also advantageous. If there are hundreds of models, maintaining or fixing models increases. Also, storage is improved because less models need to be stored. In terms of the feature normalization, there may be thousands of features, and the normalization curves may be regularly updated (every day user accounts move to a new tenure bucket, such as a user account at tenure 34 days yesterday is now at a tenure of 35 days). With hundreds of millions of user accounts and thousands of features, the normalization process cannot be practically done in the mind. It is noted that a single model is used for multiple dimension values for a cohort or cohorts. If other dimensions for cohorts are used, another single model may be used to those dimensions/dimension values.

The following is an example where the model can be used to generate predictions with cohort-agnostic feature values in an improved manner. As discussed in the Background, a model may be biased in classifying user accounts as having children. For example, a model may over-classify new users as having no children because of the recency bias of just starting out. The use of cohort-agnostic feature values may remove this bias by removing tenure related biases from the feature values associated with user accounts.

System Overview

FIG. 1 depicts a simplified system 100 for generating cohort-agnostic feature values and predictions according to some embodiments. A server system 102 may include a cohort normalization engine 104, data storage 106, and a model 108.

A feature may be a metric that may be measured for an entity, such as a user account. An entity may use a service, item, etc., and data is received for the use. For example, a feature may be based on a use of a content delivery service. Examples of features include hours watched, which may be a time in which content is played back on the content delivery service. Other features may also be appreciated, such as amount of content that is consumed (e.g., read, downloaded, uploaded, etc.). Other data may be received, such as a number of rides that are taken in a park, an amount of money that is withdrawn, etc.

A cohort may be based on different dimensions, such as time, geography, demographics, genre, etc. Different cohorts may be based on different dimension values. For example, different cohorts may be associated with different geographic locations. Also, a cohort may be formed based on a dimension. For example, a cohort may be formed for all user accounts with different tenures on a service. As will be described below, the cohort-agnostic feature values may be agnostic of a dimension for a cohort or cohorts. Entities, such as user accounts, may be cohort agnostic based on removing bias at respective dimension values for the user accounts.

Cohort normalization engine 104 receives data from multiple user accounts. The data may be based on the use of a content delivery service, such as the data is based on user accounts interacting with the content delivery service (e.g., watching content on the content delivery service). However, other data may be received, such as any data that may be associated with features that are being analyzed. Also, information for dimensions of cohorts for the features, such as tenure, region, or other dimensions, may be received.

Cohort normalization engine 104 may configure cohorts for features based on dimension values. Then, cohort normalization engine 104 may classify the data from user accounts into cohorts based on dimension values. For example, a first user account in a first country may be classified in a first cohort associated with the first country and a second user account in a second country may be classified in a second cohort associated with the second country. Also, a single cohort for all user accounts based on tenure on the service may be used.

The respective data from user accounts in a respective cohort may be used to generate normalization information, such as a normalization curve, that may describe an expected baseline of data (e.g., an average or expected behavior). Each cohort may have respective normalization information based on the data from user accounts classified in the respective cohort.

After generating the normalization information for each cohort, cohort normalization engine 104 may generate cohort-agnostic feature values for each user account. As will be described in more detail below, the user values for the features may be compared to corresponding normalization values, and the comparison is used to generate cohort-agnostic feature values. A deviation of the user value from the normalization value may be used to generate the cohort-agnostic feature values. Cohort normalization engine 104 may store the cohort-agnostic feature values in data storage 106 along with the original data received from multiple user accounts and the normalization information for the multiple cohorts.

A model 108 may be trained to generate predictions for a user account based on the cohort-agnostic feature values. Model 108 may receive one or more cohort-agnostic features values and generate a prediction. Model 108 may use a prediction network that includes parameters that are trained using the training process. Model 108 is trained to process cohort-agnostic feature values from user accounts from multiple cohorts. A single model 108 may be used to generate predictions for user accounts from different values of dimensions from cohorts. This is because model 108 is trained to process cohort-agnostic feature values to generate predictions rather than the user values that are not normalized in a cohort.

When a prediction for a user account is requested, model 108 receives a cohort-agnostic feature value. Also, multiple cohort-agnostic feature values may be analyzed at the same time as input. Other features for the user account may also be received, such as features regarding characteristics of the user account (e.g., age, genre, watch history, etc. Then, model 108 generates a prediction for the user account using the cohort-agnostic feature value (and any other features values). In some examples, one prediction may be whether a user may upgrade the service based on a feature of the number of watch hours, which may be a number of hours a user account has spent watching content within a time period. Instead of analyzing the actual number of watch hours for a user account, the cohort-agnostic feature value may be analyzed. The cohort-agnostic feature values may remove some bias from feature values based on a dimension. For example, the cumulative number of watch hours may be 100 hours for multiple user accounts. However, this number of watch hours may be considered large in one country, but small in another country. To remove this bias, the cohort-agnostic feature value may be different, such as 0.72 for a first user account and 1.09 for a second user account. Instead of using 100 hours for both user accounts, the cohort-agnostic feature value of 0.72 may indicate the first user account is watching a smaller number of hours compared to user accounts in a first country and the cohort-agnostic feature value of 1.09 may indicate the second user account is watching a larger than average number of hours compared to user accounts in a second country.

Model 108 may generate predictions for the first user account and the second user account that are different when using the cohort-agnostic feature values even though the user accounts may be associated with the same number of cumulative watch hours. The predictions may be different because of biases found in different geographic locations or tenure. The cohort-agnostic feature values may capture the bias of tenure or geographic region on the hours watched in a cohort, which allows model 108 to process the cohort-agnostic feature values with the bias removed from the dimensions of the cohort, such as from users classified in different cohorts or the same cohort.

The following will now describe the cohort normalization, the storage of data for cohort-agnostic feature values, the model training, and then the prediction process.

Cohort Normalization

FIG. 2A depicts an example of a normalization curve according to some embodiments. The following may be performed for each feature.

A cohort may be determined based on one or more dimensions. For example, a cohort may include the dimension of tenure, geography, tenure and geography, etc. for the feature of cumulative watch time. In this example, graph 200 may normalize the cumulative average watch time over tenure and geography. The tenure may be the days since the sign up for a content delivery service, which is shown on the X-axis of graph 200. The cumulative watch time in hours is shown on the Y-axis. Different geographies are captured in curve 202-1 and curve 202-2. For example, curve 202-1 may be determined based on cumulative watch time for users of all tenures in a country #1 and curve 202-2 may be determined based on cumulative watch time for users of all tenures in a country #2. Other cohorts may be formed based on other dimensions also.

A normalization curve may be drawn based on fitting a curve through normalization values. Although a normalization curve is described, the normalization information that is used may be different, such as a series of values, a function, an index, or other information may be used. In some embodiments, values may be determined that represent the average cumulative hours watched by all users within a tenure and geography defined cohort. Cohorts may be regrouped based on tenures covering a period of 10 days (so all users with tenure 1-10 are averaged into the first value, all users 11-20 are averaged in the second value, etc.). Different cohorts are defined for different geographies. The values may be connected together to generate the curves 202-1 and 202-2. Some advantages to using a curve include will be more granular (value for user of tenure of 15 days will be different than for user of tenure of 16 days), while also being smoother.

Cohort normalization engine 104 may generate graph 200 based on data from user accounts associated with the cohorts. For example, cohort normalization engine 104 may determine the user values for user accounts that are associated with the dimensions of a first cohort, such as cohort normalization engine 104 may use the dimension of country #1 to determine user accounts that are associated with the country. Then, cohort normalization engine 104 generates normalization curve 202-1 based on the data for tenure and the cumulative watch time for those user accounts. Also, cohort normalization engine 104 may determine the user values for user accounts that are associated with the dimensions of a second cohort, such as cohort normalization engine 104 may use the dimension of country #2 to determine user accounts that are associated with the country. Then, cohort normalization engine 104 generates normalization curve 202-2 based on the data for tenure and the cumulative watch time for those user accounts.

Cohort normalization engine 104 may compute the normalization values differently. In some embodiments, cohort normalization engine 104 may compute an average of the cumulative hours watched for a period for the user accounts in the cohort. For example, at days 101-110, cohort normalization engine 104 computes an average cumulative watch hours for user accounts belonging to that cohort from a tenure-perspective. If user #1 had 100 cumulative watch hours, user #2 has 200 cumulative watch hours, and user #3 had 250 cumulative watch hours at a day 105, then the average cumulative watch hours is 183.33 (550 hours/3 days) for days 101-110. Cohort normalization engine 104 may similarly compute the average cumulative watch time for the entire tenure. Cohort normalization engine 104 may then generate a curve using the values.

After generating the normalization curve, cohort normalization engine 104 may generate the cohort-agnostic feature values for user accounts. For example, for each user account that is found in the cohort, cohort normalization engine 104 determines a user value. The user value may not be at the same tenure as the original values that were calculated (e.g., day 105 compared to an aggregated value from days 101-110). Cohort normalization engine 104 may compares a respective user value to normalization curve 202 to generate the cohort-agnostic feature value for the user account. For example, two user values are shown at 204 and 206. The user values represent the cumulative watch time and tenure for the respective user accounts. User account 1 has a tenure of 40 days and cumulative watch hours of 100 hours, and user account 2 has a tenure of 200 days and cumulative watch hours of 500 hours. As can be seen from graph 200, the user account 1 value at 204 is below the average watch time over tenure for 40 days for curve 202-1, and the user account 2 value at 206 is above the average watch time over tenure for 200 days for curve 202-1. However, the two user accounts are watching the same number of hours per day of 2.5 hours per day (100 hours/40 days vs. 500 hours/200 days). If the average of 2.5 hours per day is used as the input to generate the prediction, user account 1 and user account 2 may receive the same prediction. However, using the cohort-agnostic feature values, user account 1 and user account 2 may receive different predictions because the user accounts have different cohort-agnostic feature values as bias from tenure is removed from the cohort-agnostic feature value. Also, the use of another dimension of geography may also alter the prediction. For user account value 1, the cumulative watch hours may be considered "low" if user account 1 is part of the geographic cohort of curve 202-1, but "high" if user account 1 is part of the geographic cohort of curve 202-2. That is, the user account 1 value is below the average cumulative watch time in country #1, but above the average cumulative watch time in country #2. This results in different cohort agnostic feature values.

The following describes an example of determining cohort-agnostic feature values. FIG. 2B depicts a table 208 that summarizes data for user accounts according to some embodiments. Columns 210, 212, 214, 216, and 218 describe the user account, tenure in days, cumulative watch time in hours, a normalization value of the watch time in hours, and the cohort-agnostic feature value that is computed as a ratio.

A first row at 220 depicts information for user account 1 and a second row depicts information for a user account 2. User account 1 has a tenure of 40 days since signup and a cumulative watch time of 100 hours; and user account 2 has a tenure of 200 days since signup and a cumulative watch time of 500 hours. The normalization value for user account 1 is 138 cumulative watch hours at day 40, and the normalization value for user account 2 is 458 cumulative watch hours at day 200. In this example, the cohort-agnostic feature value is generated as a ratio of cumulative watch hours over the normalized value. For example, user account 1 has a cohort-agnostic value of 100/138=0.72, and user account 2 is 500/458=1.09. The value of 0.72 indicates that user account 1 is under-watching compared to the average behavior (e.g., 100 hours compared to 138 hours) at day 40; and user account 2 is over-watching compared to the average behavior (e.g., 500 hours compared to 458 hours) at day 200.

The cohort-agnostic feature value provides more information about the behavior of the user account. Previously, the cumulative watch time would require some information about tenure to be helpful because 100 hours and 500 hours without using tenure may mean different things. However, even using tenure, the two user accounts have an average watch time of 2.5 hours a day, which may have generated the same prediction for user account 1 and user account 2. Using cohort-agnostic feature values, the ratio of 0.72 and 1.09 provides more information about the watch behavior of user account 1 and user account 2. The cohort-agnostic feature value is also agnostic of the tenure of the user account because the normalization is based upon the normalization value of normalization curve 202 for the tenure of the respective user account. That is, the behavior of the user account compared to other user accounts with the same tenure may remove the bias of tenure. Also, the cohort-agnostic feature values may be agnostic of other dimensions, such as geographic locations. Here, another cohort in another region may have its own normalization curve. The resulting cohort-agnostic feature values may be generated for user accounts in the other cohort using its own normalization curve.

Data Storage

Figure 3:
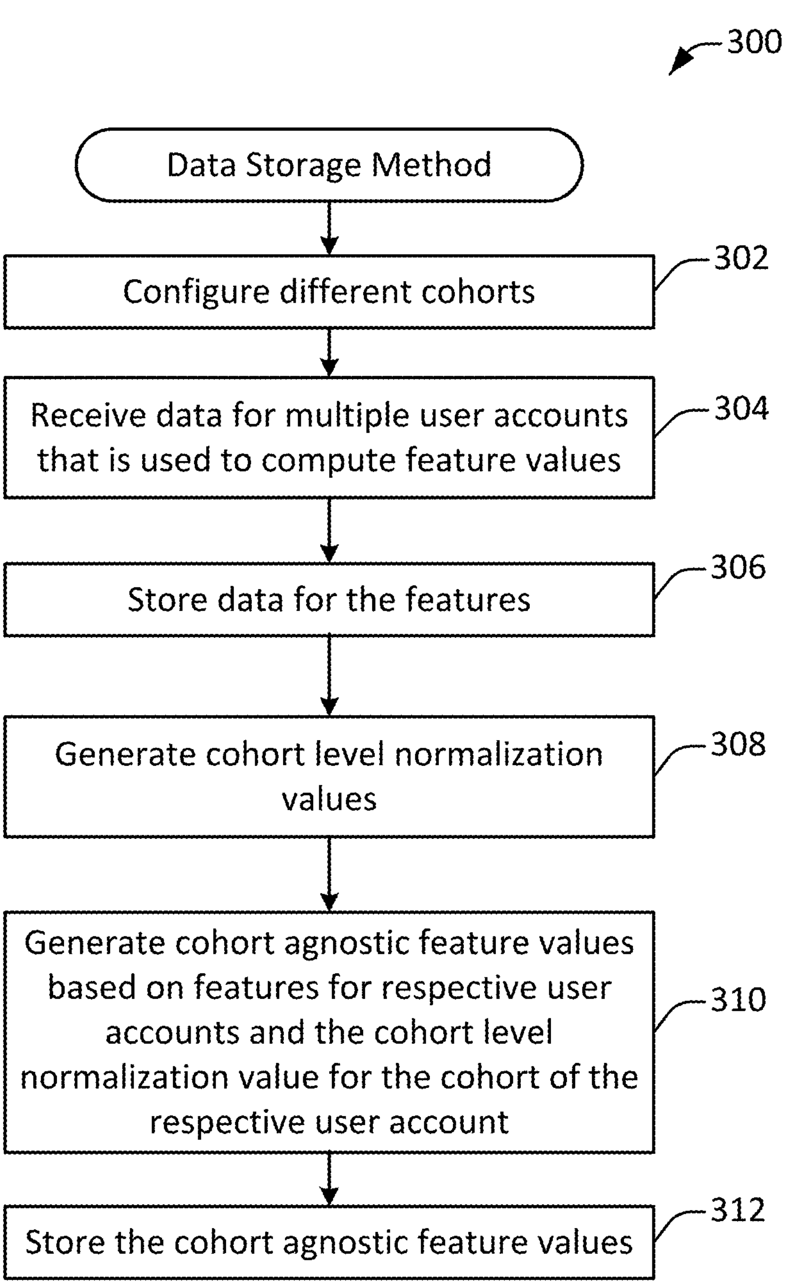
FIG. 3 depicts a simplified flowchart for a method for storing cohort-agnostic feature values, according to some embodiments.

FIG. 3 depicts a simplified flowchart 300 for a method for storing cohort-agnostic feature values according to some embodiments. At 302, cohort normalization engine 104 configures different cohorts. The cohorts may be based on different dimensions. In some embodiments, the dimensions may be based on region, time, or other dimensions. Combinations of dimensions may also be appreciated, such as region and tenure to form multiple cohorts for a feature, or a single cohort for a feature, such as a cohort for tenure.

At 304, cohort normalization engine 104 receives data for multiple user accounts that is used to compute feature values. The features may be different features, such as cumulative watch hours. The data may be information from the use of the content delivery service for the user accounts.

For example, the cohort normalization engine 104 may receive information for hours of content that is watched per day for the user accounts. Cohort normalization engine 104 may generate a cumulative hours watched value based on the information that is received every day. Also, cohort normalization engine 104 may receive a signup time for each user account in which the tenure for each user account may be calculated.

At 306, cohort normalization engine 104 stores data for the features in data storage 106. For example, the data for the features may be stored in a feature store table in data storage 106. An example of the data that is stored may be a cumulative watch hour value (e.g., 100 hours), a tenure in a number of days (e.g., 40 days), etc.

At 308, cohort normalization engine 104 generates cohort level normalization values. For example, cohort normalization engine 104 may use values stored in the feature store table to generate normalization values for the features in the feature store table. If a feature is the cumulative watch hours, cohort normalization engine 104 may calculate an average value using the cumulative watch hours in the feature store table for the user accounts at each day. For a day #1, if the cumulative watch hours are 100 hours, 150 hours, and 250 hours, cohort normalization engine 104 may determine the average cumulative watch hours is 166.67 for day #1. Then, cohort normalization engine 104 generates the average cumulative watch hours for day 2, day 3, and so on. Cohort normalization engine 104 may store the average cumulative watch hours for each day in a normalization value store table in data storage 106. Also, the average cumulative watch hours from multiple days can be used to generate the normalization curve, such as via a fitting algorithm.

At 310, cohort normalization engine 104 generates cohort-agnostic feature values based on features for the respective user accounts and the cohort level normalization values for the cohort of the respective user account. Cohort normalization engine 104 may use feature values in the feature store table and normalization values in the normalization value store table in data storage 106 to generate cohort-agnostic feature values. For example, for a user account 1, cohort normalization engine 104 retrieves a user value from the feature store table in data storage 106 and a normalization value from the normalization value store table in data storage 106. Then, cohort normalization engine 104 generates the cohort-agnostic feature value, such as a value of 0.72 for account 1, and a value of 1.09 for account 2.

At 312, cohort normalization engine 104 stores the cohort-agnostic feature values in a cohort-agnostic feature value table. For example, for a user account 1, cohort normalization engine 104 stores the cohort-agnostic feature value of 0.72 for account 1 and stores the value of 1.09 for account 2 in the cohort-agnostic feature value table in data storage 106. Although three tables are discussed above, the data may be stored in different ways, such as in a single table as shown in FIG. 2B, or in any number of tables or database formats.

Also, the data may be generated or stored at different times. For example, the generation of the cohort-agnostic feature values may be generated in real-time when a request for a prediction for a user account is received. However, the cohort-agnostic feature values may be pre-computed and updated over time as more or new data for user accounts is received.

Model Training

Figure 4:
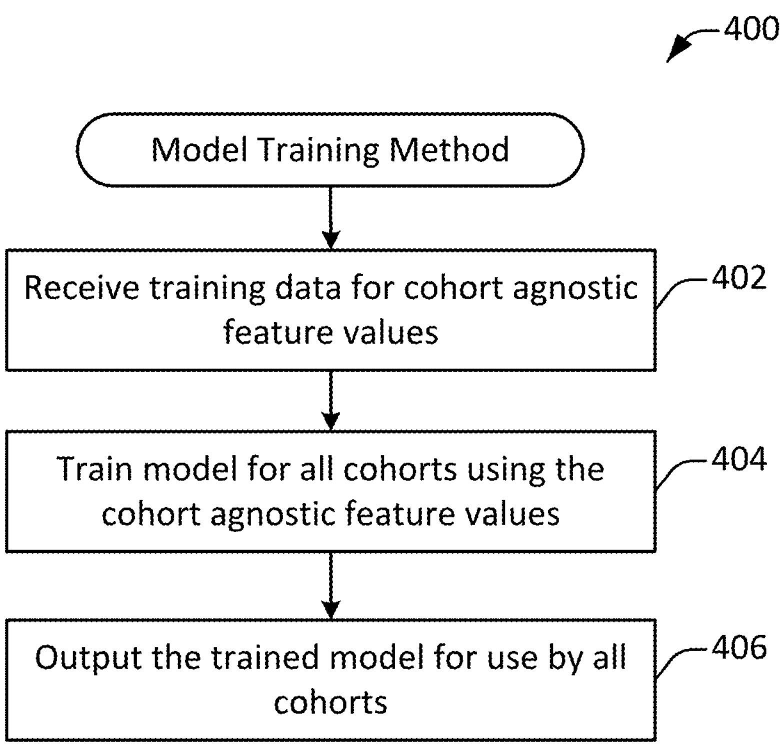
FIG. 4 depicts a simplified flowchart of a method for a training a model according to some embodiments.

Model 108 may be trained to process the cohort-agnostic feature values. FIG. 4 depicts a simplified flowchart 400 of a method for training of model 108 according to some embodiments. At 402, training data for cohort-agnostic feature values is received. The training of model 108 may be different from the training of different models that are used for different cohorts as described in the Background. The training of different models for different cohorts would involve determining training data from user accounts for different cohorts. For example, training data 1 for a cohort 1 is determined for a model that will be used for that cohort, training data 2 is determined for a cohort 2 for a second model, etc. If cohort 1 is for a tenure of under 100 days, training data 1 is from user accounts with a tenure under 100 days and not over 100 days. Also, If cohort 2 is for a tenure of over 100 days, training data 2 is from user accounts with a tenure over 100 days and not under 100 days. Each model is trained using its respective training data such that the model can interpret training data that is relevant to its respective cohort. However, training data using cohort-agnostic feature values from user accounts that would have been in different cohorts may be used. That is, the training data is agnostic of dimension values that would have been used to train different models. As discussed above, model 108 is trained on processing cohort-agnostic feature values.

During the training, at 404, in some embodiments, a single model 108 is trained using the cohort-agnostic feature values for different values of dimensions for a cohort. In some embodiments, known outcomes for the user accounts with different dimension values is known, the respective cohort-agnostic feature values of the user accounts are used to train model 108 to generate the predictions. Then, depending on the prediction of model 108, the parameters of model 108 may be adjusted such that the prediction of model 108 converges to predict the known outcome. Other methods of training model 108 may be appreciated. At 406, the trained model 108 is output. After training model 108, predictions may be generated.

Prediction

Figure 5:
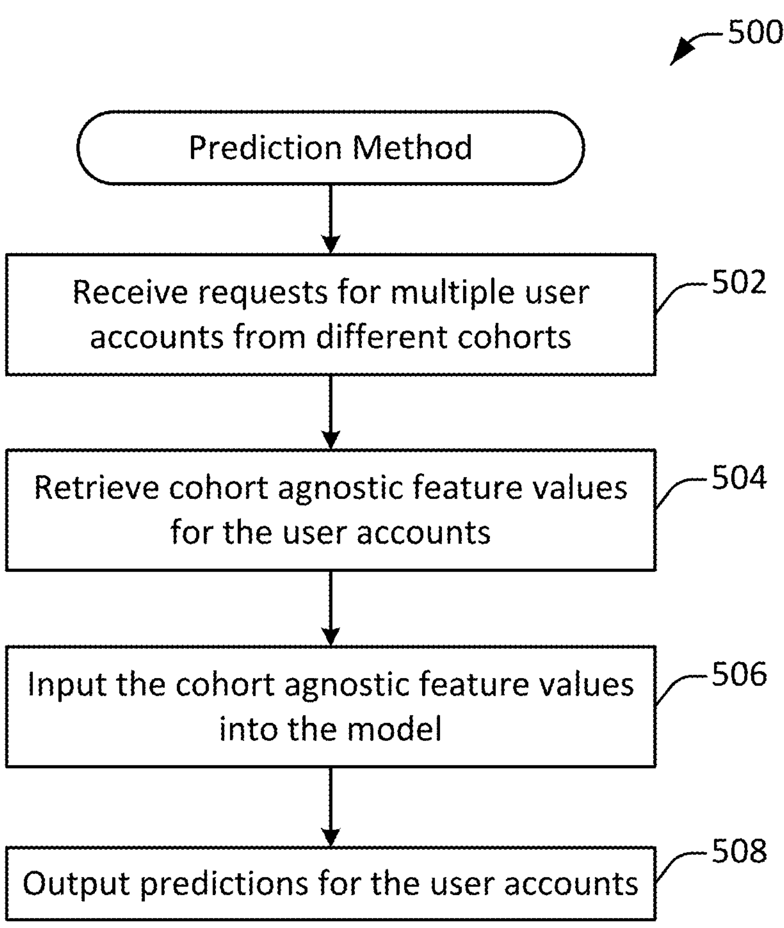
FIG. 5 depicts a simplified flowchart of a method for generating predictions according to some embodiments.

FIG. 5 depicts a simplified flowchart 500 of a method for generating predictions according to some embodiments. At 502, cohort normalization engine 104 receives requests for multiple user accounts from different cohorts. For example, the requests may be for a prediction of whether the user accounts may upgrade the service, downgrade the service, be classified in a demographic classification, etc.

At 504, cohort-agnostic feature values are retrieved for the user accounts. In some embodiments, the cohort-agnostic feature values that were pre-computed and stored in the cohort-agnostic feature value table may be retrieved. In other embodiments, the cohort-agnostic feature values may be computed dynamically. Using the cohort-agnostic feature values means the system does not need to determine the cohort that is associated with the multiple user accounts. Rather, the cohort-agnostic feature values may be retrieved for each user account. This may increase the speed of generating the prediction, because the feature values are cohort-agnostic and the request for user accounts can be treated as the same without having to classify user accounts in different cohorts based on their respective characteristics.

At 506, the cohort-agnostic feature values are input into model 108. As discussed above, a single model may be used to process the cohort-agnostic feature values from user accounts that may have been associated with different values for dimensions of cohorts.

At 508, model 108 outputs predictions for the user accounts. For example, the predictions may be a score associated with the desired prediction. For example, the score may be a probability that user accounts will upgrade the service, downgrade the service, are part of a demographic group, etc. In some examples, the score of 0.25 may indicate the user account may not be likely to upgrade the service, and the score of 0.90 may indicate the user account may be more likely to upgrade the service. The score may also indicate a satisfaction with the service, a rating of the service, etc. In other embodiments, other models may predict a time until an event will happen. Also, by looking at other models outputs (not just the score), the system can also generate insights into why the model made the prediction (e.g., insufficient engagement, bad experiences, etc.)

Figure 6:
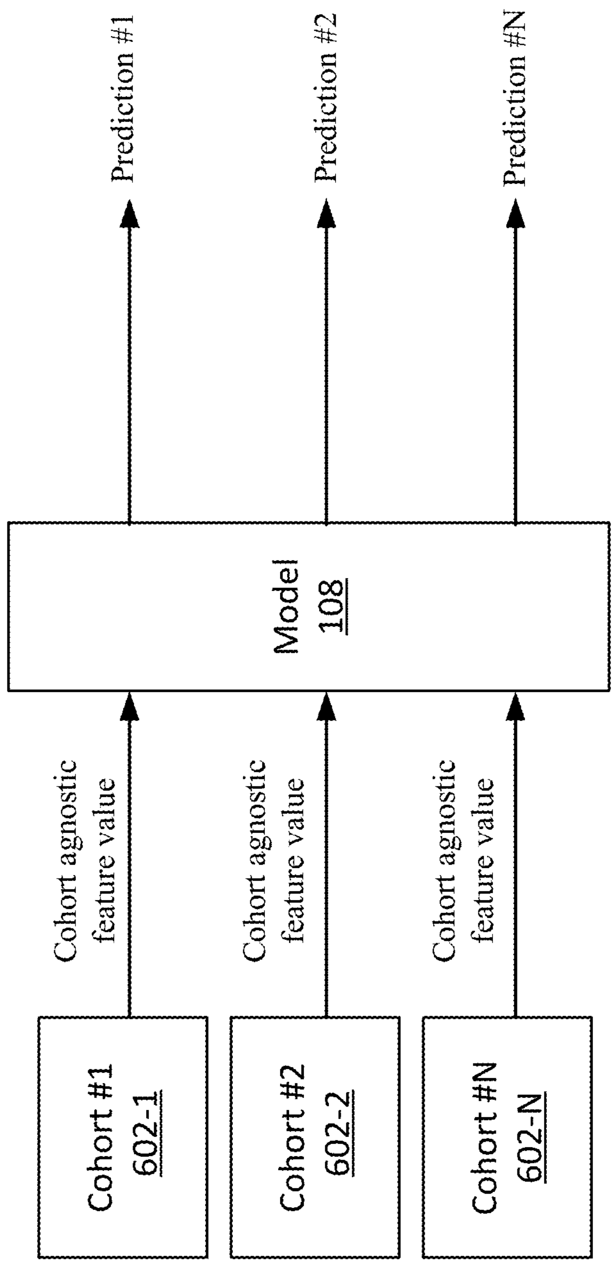
FIG. 6 depicts an example of using model to generate predictions from multiple cohorts according to some embodiments.

FIG. 6 depicts an example of using model 108 to generate predictions from multiple cohorts according to some embodiments. User accounts may be classified in multiple cohorts. For example, cohorts of cohort #1 602-1, cohort #2 602-2, and cohort #N 602-N may be provided. In some examples, user account #1 is classified in cohort #1 602-1, user account #2 is classified in cohort #2 602-2, and cohort #N is classified in a cohort #N 602-N.

In some embodiments, user account #1 may be based in a country #1, user account #2 is based in a country #2, and user #N is based in a country #N. Each cohort is associated with a different country. When a prediction for a respective user account is desired, cohort-agnostic feature values are received at a single model 108. Then, model 108 generates predictions for user account #1, user account #2, and user account #N as prediction #1, prediction #2, and prediction #N. Accordingly, a single model 108 is used to process user accounts from different cohorts.

Conclusion

The use of cohort-agnostic feature values may remove a bias from different dimensions in the model. Accordingly, multiple models do not need to be trained, which saves resource time. Also, multiple models do not need to be stored, which saves storage space. The processing of feature values to generate cohort-agnostic feature values is performed to allow the use of the single model. Also, rather than having to determine which cohort in which a user account is associated, the cohort-agnostic feature value may be used for all user accounts regardless of their respective cohort.

System

Figure 7:
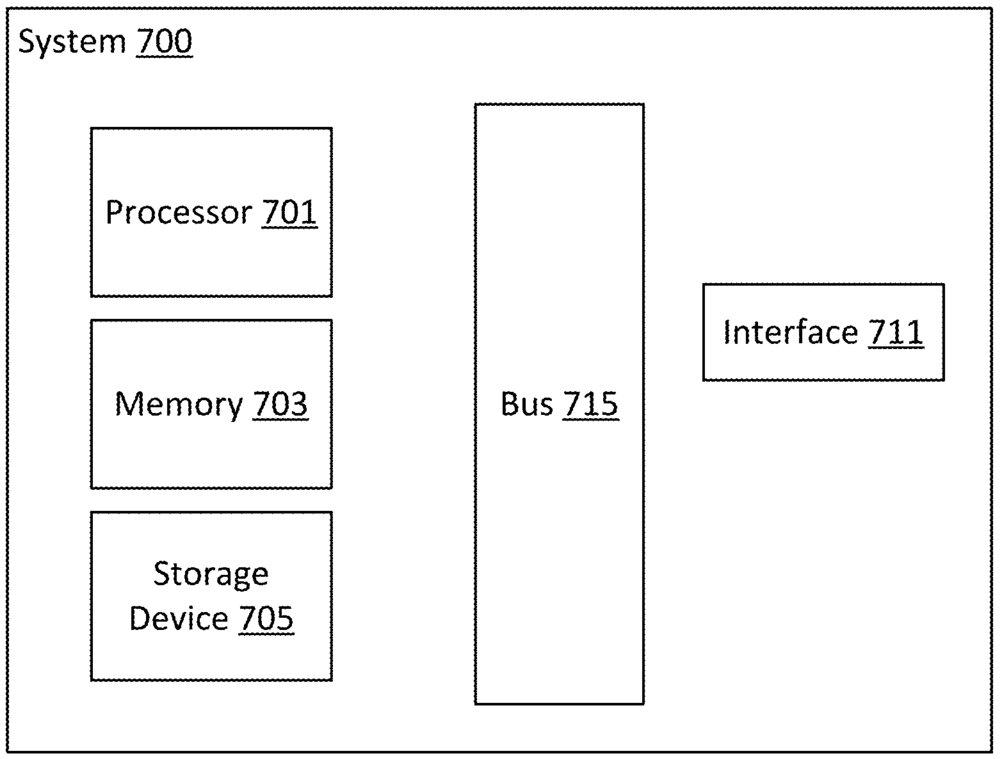
FIG. 7 illustrates one example of a computing device.

FIG. 7 illustrates one example of a computing device. According to various embodiments, a system 700 suitable for implementing embodiments described herein includes a processor 701, a memory module 703, a storage device 705, an interface 711, and a bus 715 (e.g., a PCI bus or other interconnection fabric.) System 700 may operate as variety of devices such as server system 102, or any other device or service described herein. Although a particular configuration is described, a variety of alternative configurations are possible. The processor 701 may perform operations such as those described herein. Instructions for performing such operations may be embodied in the memory 703, on one or more non-transitory computer readable media, or on some other storage device. Various specially configured devices can also be used in place of or in addition to the processor 701. The interface 711 may be configured to send and receive data packets over a network. Examples of supported interfaces include, but are not limited to: Ethernet, fast Ethernet, Gigabit Ethernet, frame relay, cable, digital subscriber line (DSL), token ring, Asynchronous Transfer Mode (ATM), High-Speed Serial Interface (HSSI), and Fiber Distributed Data Interface (FDDI). These interfaces may include ports appropriate for communication with the appropriate media. They may also include an independent processor and/or volatile RAM. A computer system or computing device may include or communicate with a monitor, printer, or other suitable display for providing any of the results mentioned herein to a user.

Any of the disclosed implementations may be embodied in various types of hardware, software, firmware, computer readable media, and combinations thereof. For example, some techniques disclosed herein may be implemented, at least in part, by non-transitory computer-readable media that include program instructions, state information, etc., for configuring a computing system to perform various services and operations described herein. Examples of program instructions include both machine code, such as produced by a compiler, and higher-level code that may be executed via an interpreter. Instructions may be embodied in any suitable language such as, for example, Java, Python, C++, C. HTML, any other markup language, JavaScript, ActiveX, VBScript, or Perl. Examples of non-transitory computer-readable media include, but are not limited to: magnetic media such as hard disks and magnetic tape; optical media such as flash memory, compact disk (CD) or digital versatile disk (DVD); magneto-optical media; and other hardware devices such as read-only memory ("ROM") devices and random-access memory ("RAM") devices. A non-transitory computer-readable medium may be any combination of such storage devices.

In the foregoing specification, various techniques and mechanisms may have been described in singular form for clarity. However, it should be noted that some embodiments include multiple iterations of a technique or multiple instantiations of a mechanism unless otherwise noted. For example, a system uses a processor in a variety of contexts but can use multiple processors while remaining within the scope of the present disclosure unless otherwise noted. Similarly, various techniques and mechanisms may have been described as including a connection between two entities. However, a connection does not necessarily mean a direct, unimpeded connection, as a variety of other entities (e.g., bridges, controllers, gateways, etc.) may reside between the two entities.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured or operable to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments and are presented to illustrate the flexibility and advantages of some embodiments as defined by the following claims. Based on the above disclosure and the following claims, other arrangements, embodiments, implementations, and equivalents may be employed without departing from the scope hereof as defined by the claims.

What is claimed is:

1. A method comprising:

receiving, by a computing device, a first value for a feature, wherein the first value is associated with an entity;

determining, by the computing device, a cohort for the entity, wherein a cohort is associated with a dimension, and the entity is associated with a dimension value for the dimension;

determining, by the computing device, a normalization value for the cohort based on the dimension value for the entity, wherein the normalization value is generated based on second values at the dimension value for the feature, and wherein the second values are associated with entities in the cohort;

generating, by the computing device, a cohort-agnostic feature value based on the first value and the normalization value; and inputting, by the computing device, the cohort-agnostic feature value into a single model to generate a prediction for the entity, wherein the single model is used to process cohort-agnostic feature values from multiple entities that are associated with different dimension values.

2. The method of claim 1, wherein:

the multiple entities are associated with multiple cohorts, and cohorts in the multiple cohorts are associated with different dimension values.

3. The method of claim 1, wherein the first value is based on a use of a service by the entity.

4. The method of claim 1, wherein the first value changes as the dimension value changes for the entity.

5. The method of claim 1, further comprising:

determining a plurality of values for entities that are associated with the cohort at different dimension values; and computing normalization values for the cohort based on the plurality of values at different dimension values.

6. The method of claim 1, wherein generating the cohort-agnostic feature value comprises:

comparing the first value to the normalization value; and computing the cohort-agnostic feature value based on a difference between the first value to the normalization value.

7. The method of claim 1, wherein generating the cohort-agnostic feature value comprises:

computing the cohort-agnostic feature value based on a ratio of the first value and the normalization value.

8. The method of claim 1, wherein:

the feature comprises a cumulative value over the dimension; and the normalization value is based on cumulative values for the feature at the dimension value from entities in the cohort.

9. The method of claim 1, wherein:

the dimension comprises a time period, and the second values for the entities in the cohort change over the time period, and normalization values are calculated at times within the time period based on respective second values for entities at the respective times.

10. The method of claim 1, wherein:

the dimension value comprises a first dimension value, cohorts in a plurality of cohorts are associated with different second dimension values; and the cohort is selected from the plurality of cohorts based on a second dimension value of the entity corresponding to a second dimension value of the cohort.

11. The method of claim 10, wherein the second dimension values are based on different geographic locations.

12. The method of claim 1, wherein:

the single model is used to process cohort-agnostic feature values from a plurality of cohorts that are associated with different dimension values.

13. The method of claim 1, wherein:

the single model is used to process cohort-agnostic feature values from multiple entities that are associated with different dimension values of a same dimension.

14. A non-transitory computer-readable storage medium having stored thereon computer executable instructions, which when executed by a computing device, cause the computing device to be operable for:

receiving a first value for a feature, wherein the first value is associated with an entity;

determining a cohort for the entity, wherein a cohort is associated with a dimension, and the entity is associated with a dimension value for the dimension;

determining a normalization value for the cohort based on the dimension value for the entity, wherein the normalization value is generated based on second values at the dimension value for the feature, and wherein the second values are associated with entities in the cohort;

generating a cohort-agnostic feature value based on the first value and the normalization value; and inputting the cohort-agnostic feature value into a single model to generate a prediction for the entity, wherein the single model is used to process cohort-agnostic feature values from multiple entities that are associated with different dimension values.

15. The non-transitory computer-readable storage medium of claim 14, further operable for:

determining a plurality of values for entities that are associated with the cohort at different dimension values; and computing normalization values for the cohort based on the plurality of values at different dimension values.

16. The non-transitory computer-readable storage medium of claim 14, wherein:

the dimension value comprises a first dimension value, cohorts in a plurality of cohorts are associated with different second dimension values; and the cohort is selected from the plurality of cohorts based on a second dimension value of the entity corresponding to a second dimension value of the cohort.

17. The non-transitory computer-readable storage medium of claim 14, wherein:

the multiple entities are associated with multiple cohorts, and cohorts in the multiple cohorts are associated with different dimension values.

18. The non-transitory computer-readable storage medium of claim 14, wherein the first value is based on a use of a service by the entity.

19. The non-transitory computer-readable storage medium of claim 14, wherein the first value is based on a use of a service by the entity.

20. An apparatus comprising:

one or more computer processors; and a computer-readable storage medium comprising instructions for controlling the one or more computer processors to be operable for:

receiving a first value for a feature, wherein the first value is associated with an entity;

determining a cohort for the entity, wherein a cohort is associated with a dimension, and the entity is associated with a dimension value for the dimension;

determining a normalization value for the cohort based on the dimension value for the entity, wherein the normalization value is generated based on second values at the dimension value for the feature, and wherein the second values are associated with entities in the cohort;

generating a cohort-agnostic feature value based on the first value and the normalization value; and inputting the cohort-agnostic feature value into a single model to generate a prediction for the entity, wherein the single model is used to process cohort-agnostic feature values from multiple entities that are associated with different dimension values.

* * * * *